US010094043B2

(12) United States Patent
Takashima et al.

(10) Patent No.: US 10,094,043 B2
(45) Date of Patent: Oct. 9, 2018

(54) METHOD FOR PRODUCING SINGLE CRYSTAL WITH REDUCED NUMBER OF CRYSTAL DEFECTS

(71) Applicant: SHIN-ETSU HANDOTAI CO., LTD., Tokyo (JP)

(72) Inventors: Shou Takashima, Sabae (JP); Yuuichi Miyahara, Echizen (JP); Atsushi Iwasaki, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/506,478

(22) PCT Filed: Aug. 25, 2015

(86) PCT No.: PCT/JP2015/004258
§ 371 (c)(1),
(2) Date: Feb. 24, 2017

(87) PCT Pub. No.: WO2016/038817
PCT Pub. Date: Mar. 17, 2016

(65) Prior Publication Data
US 2017/0260646 A1    Sep. 14, 2017

(30) Foreign Application Priority Data

Sep. 12, 2014    (JP) .................................. 2014-186166

(51) Int. Cl.
*C30B 15/22* (2006.01)
*C30B 29/06* (2006.01)

(52) U.S. Cl.
CPC .............. *C30B 15/22* (2013.01); *C30B 29/06* (2013.01)

(58) Field of Classification Search
CPC .......... C30B 15/00; C30B 15/20; C30B 15/22; C30B 15/26; C30B 15/28; C30B 29/00; C30B 29/02; C30B 29/06
(Continued)

(56) References Cited

U.S. PATENT DOCUMENTS 4,915,775 A    4/1990  Katsuoka et al.
5,419,277 A *  5/1995  Urano ..................... C30B 15/26
                                                    117/201
(Continued)

FOREIGN PATENT DOCUMENTS

JP    H05-59876 B2    9/1993
JP    H06-92784 A     4/1994
(Continued)

OTHER PUBLICATIONS

Mar. 14, 2017 International Preliminary Report on Patentability issued in International Patent Application No. PCT/JP2015/004258.
(Continued)

*Primary Examiner* — Kenneth A Bratland, Jr.
(74) *Attorney, Agent, or Firm* — Oliff PLC

(57) ABSTRACT

A method for producing a single crystal, wherein the space is adjusted to a predetermined distance by measuring a distance from a reference height position at a predetermined height above a melt surface to a lower end part of an in-furnace structure in a state wherein the in-furnace structure above the melt surface is installed in a pull chamber, obtaining a lower end part position error which is a difference between measured distance and a distance from the previously set reference height position to the lower end part of the in-furnace structure, obtaining a target distance from the melt surface to the reference height position by adding the lower end part position error and a distance from the reference height position to a melt surface position, and
(Continued)

adjusting a distance from an initial position of the melt surface to the reference height position such that the target distance is attained.

2 Claims, 3 Drawing Sheets

(58) Field of Classification Search
USPC .............. 117/11, 13–15, 35, 200–202, 928, 117/931–932
See application file for complete search history.

(56) References Cited

U.S. PATENT DOCUMENTS

| 2009/0232359 A1 | 9/2009 | Urano et al. |
| 2010/0165321 A1 | 7/2010 | Hayashida et al. |
| 2013/0263773 A1 | 10/2013 | Takanashi et al. |

FOREIGN PATENT DOCUMENTS

| JP | 06293590 A | * 10/1994 | ............. C30B 15/26 |
| JP | H06-293590 A | 10/1994 | |
| JP | H07-277879 A | 10/1995 | |
| JP | H07-330484 A | 12/1995 | |
| JP | 2007-290906 A | 11/2007 | |

OTHER PUBLICATIONS

Nov. 10, 2015 International Search Report issued in International Patent Application No. PCT/JP2015/004258.
Jan. 23, 2018 Office Action issued in Japanese Patent Application No. 2016-547672.
Jul. 30, 2018 Office Action issued in Chinese Application No. 201580048867.7.

* cited by examiner

METHOD FOR PRODUCING SINGLE CRYSTAL WITH REDUCED NUMBER OF CRYSTAL DEFECTS

TECHNICAL FIELD

The present invention relates to a production method for controlling the concentration of oxygen in a silicon single crystal and preventing the generation of crystal defects typified by Oxidation-induced Stacking Faults (hereinafter also referred to as OSFs) in producing a silicon single crystal by the Czochralski method (hereinafter also referred to as the CZ method).

BACKGROUND ART

As a method for producing a single crystal, the CZ method by which a crystal is pulled upwardly from raw material melt in a crucible while being grown has been widely practiced. In producing a silicon single crystal by the CZ method, by adjusting the rate of flow of argon, the furnace pressure, and the distance (hereinafter also referred to as a melt surface space) between a melt surface and a lower end part of an in-furnace structure, control of the concentration of oxygen in the crystal is performed and the number of crystal defects such as OSFs is reduced.

For example, in Patent Document 1, a method for adjusting the melt surface to a predetermined position with reference to the height position of a seed crystal by adding a sensor to a pulling apparatus is proposed. Moreover, in Patent Document 2, a method for adjusting the melt surface space by projecting light onto the melt surface and detecting the light reflected from the melt surface is proposed.

Furthermore, in Patent Document 3, a method for adjusting the melt surface space by bringing a position measuring apparatus into direct contact with melt is described. In addition, in Patent Document 4, a method for adjusting the melt surface space by detecting the projected image of a lower part of a radiation prevention cylinder and moving the radiation prevention cylinder upward or downward is proposed. Moreover, in Patent Document 5, a method for measuring the relative distance between a reference reflector disposed above the melt surface and the melt surface is proposed.

CITATION LIST

Patent Literature

Patent Document 1: Japanese Examined Patent publication (Koukoku) No. H5-59876
Patent Document 2: Japanese Unexamined Patent publication (Kokai) No. H6-92784
Patent Document 3: Japanese Unexamined Patent publication (Kokai) No. H7-330484
Patent Document 4: Japanese Unexamined Patent publication (Kokai) No. H7-277879
Patent Document 5: Japanese Unexamined Patent publication (Kokai) No. 2007-290906

SUMMARY OF INVENTION

Technical Problem

However, with the method of Patent Document 1, while it is possible to adjust the melt surface space to a predetermined distance with high reproducibility if the in-furnace structure is not changed, if a part forming the in-furnace structure is replaced with another, the production dimensional error or fit error thereof reduces the reproducibility of the melt surface space, which undesirably causes a loss of the effect of reducing the number of crystal defects.

To address the above problem, in order to dispose the position of the lower end part of the in-furnace structure with high precision, it may be necessary to improve the production dimensional precision of each part or change the shape thereof to a shape that is less likely to cause a fit error and narrow the range of variations in characteristics, for example, for variations in characteristics of thermal expansion. However, the number of parts on which the above processing has to be performed becomes large and the above processing has to be performed on all of them, which undesirably increases the production costs of the parts.

Moreover, in Patent Document 2, the optical system including a laser projecting portion, a light receiving portion, a laser light passage portion, and so forth becomes complicated, which undesirably makes it necessary for an expensive optical system to improve the measurement precision.

Furthermore, in the method of Patent Document 3, since the length is changed as a result of the position measuring apparatus being brought into contact with the melt surface, the repeatability is undesirably low.

In addition, in Patent Document 4, a radiation prevention cylinder up-and-down movement mechanism is necessary, which makes the apparatus expensive. Furthermore, spattered melt which is caused in the course of melting a solid silicon raw material adheres to the lower surface of the radiation prevention cylinder and changes the projected image, which makes it impossible to perform accurate measurement of the melt position.

Moreover, also in Patent Document 5, spattered melt which is caused in the course of melting a solid silicon raw material adheres to the reflector and changes the mirror image, which makes it impossible to perform accurate measurement of the melt position.

As described above, if an area which requires precision is locally provided inside a furnace, it is impossible to prevent the occurrence of a situation in which this part ceases functioning, and a proper means for solving such a problem has been sought after.

The present invention has been made in view of the problems, and an object thereof is to provide a method for producing a single crystal, the method that can adjust a melt surface space to a predetermined distance even when a part forming an in-furnace structure is replaced with another without locally providing an area which requires precision inside a furnace.

Solution to Problem

To attain the object, the present invention provides a method for producing a single crystal, the method by which, when a single crystal is grown by the Czochralski method by pulling the single crystal upwardly by a wire from raw material melt in a crucible, a single crystal is grown by adjusting a space between a melt surface of the raw material melt and a lower end part of an in-furnace structure which is disposed above the melt surface to a predetermined distance, wherein the space is adjusted to a predetermined distance by measuring a distance from a reference height position at a predetermined height above the melt surface to the lower end part of the in-furnace structure in a state in which the in-furnace structure above the melt surface is installed in a pull chamber, obtaining a lower end part position error which is a difference between the measured distance and a distance from the previously set reference height position to the lower end part of the in-furnace structure, obtaining a target distance from the melt surface to the reference height position by adding the lower end part position error and a distance from the reference height position to a melt surface position, and adjusting a distance from an initial position of the melt surface to the reference height position such that the target distance is attained.

By so doing, it is possible to adjust a melt surface space to a predetermined distance even when a part forming the in-furnace structure is replaced with another without locally providing an area which requires precision inside a furnace. As a result, when a single crystal is produced, it is possible to reduce the number of crystal defects.

At this time, it is preferable that, when the target distance is obtained, the target distance is obtained by estimating a length by which the in-furnace structure above the melt surface subjected to measurement of the distance to the lower end part of the in-furnace structure changes by thermal expansion, obtaining, when the distance from the reference height position to the lower end part of the in-furnace structure is set in advance, a thermal expansion error which is a difference between a previously set thermal expansion reference length of the in-furnace structure and the estimated length, and adding up the thermal expansion error, the lower end part position error, and the distance from the reference height position to the melt surface position.

By so doing, even when the in-furnace structure changes by thermal expansion, it is possible to adjust the melt surface space to a predetermined distance more reliably.

Advantageous Effects of Invention

With the method for producing a single crystal of the present invention, it is possible to adjust a melt surface space to a predetermined distance even when a part forming an in-furnace structure is replaced with another without locally providing an area which requires precision inside a furnace. As a result, it is possible to reduce the number of crystal defects.

DESCRIPTION OF EMBODIMENTS

Hereinafter, the present invention will be described in detail with reference to the drawings, but the present invention is not limited to those which will be described below.

Figure 1:
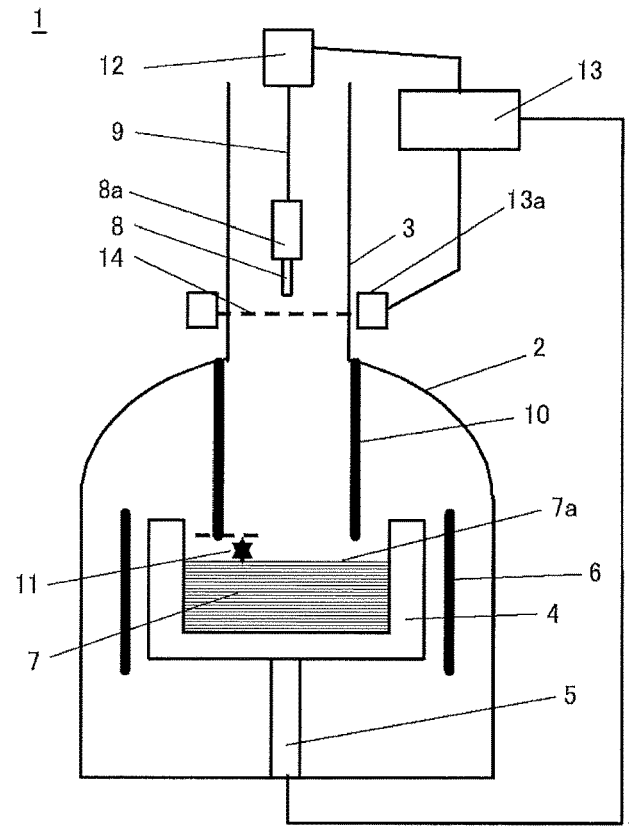
FIG. 1 is a schematic diagram depicting an example of a single crystal production apparatus that can be used in the present invention.

First, a single crystal production apparatus that can be used in a method for producing a single crystal of the present invention will be described. As depicted in FIG. 1, a silicon single crystal production apparatus 1 includes a main chamber 2 and a pull chamber 3 connected thereto.

In the main chamber 2, a crucible 4, a, crucible holding shaft 5 that holds the crucible 4, and a heater 6 that is provided around the perimeter of the crucible 4 are disposed. Then, a raw material polycrystal with which the crucible 4 is filled is melted by being heated by the heater 6, whereby raw material melt 7 is obtained.

In addition, above a melt surface 7a of the raw material melt 7, a seed crystal holder 8a for holding a seed crystal 8 and a wire 9 for pulling the seed crystal holder 8a upwardly are provided coaxially with the crucible holding shaft 5.

Moreover, in the pull chamber 3, an in-furnace structure 10 is provided, and, between the melt surface 7a and a lower end part of the in-furnace structure 10, a melt surface space 11 is left.

Furthermore, the crucible holding shaft 5 has a crucible driving portion (not depicted in the drawing) for rotating the crucible 4 and moving the crucible 4 upward and downward. In addition, the wire 9 has a wire driving portion 12 for winding the wire 9 to move the seed crystal holder 8a upward, unwinding the wire 9 to move the seed crystal holder 8a downward, and rotating the seed crystal holder 8a.

As for the operation of the crucible driving portion and the wire driving portion 12, a control portion 13 can control the vertical and rotational movements by outputting a command signal to each driving portion. Moreover, to the control portion 13, a sensor 13a is electrically connected.

Next, a method for growing a single crystal of the present invention will be described.

Figure 2:
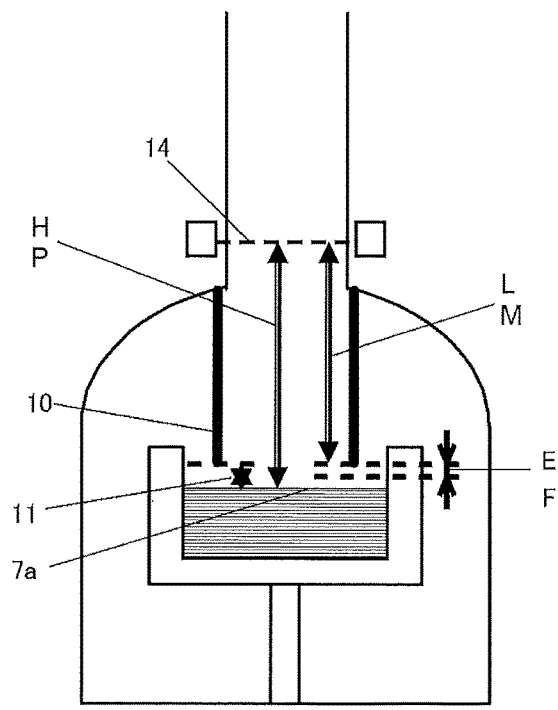
FIG. 2 is a schematic diagram depicting an area in which a distance is measured or an area in which a distance is determined in advance in the single crystal production apparatus that can be used in the present invention.

First, prior to an adjustment of an initial position of the melt surface 7a, the in-furnace structure 10 is assembled and installed in the pull chamber 3. In this state, a distance M (refer to FIG. 2) from a reference height position 14 located at a predetermined height above the melt surface 7a to the lower end part of the in-furnace structure 10 is obtained by measurement.

For measurement of the distance M from the reference height position 14 to the lower end part of the in-furnace structure 10, a dedicated length measuring instrument or a measurement method which will be described below can be used as appropriate.

For example, a case where the wire driving portion 12 and the sensor 13a are used will be described.

First, a flat surface is formed by closing the lower end part of the in-furnace structure 10 with a flat plate. Next, the seed crystal 8 is moved downward by unwinding the wire 9 by the wire driving portion 12. Then, the distance from a position in which the lower end of the seed crystal 8 is detected by the sensor 13a to a position to which the wire 9 is unwound by the wire driving portion 12 until the lower end of the seed crystal 8 reaches the flat part formed at the lower end of the in-furnace structure 10 is measured. The measured distance can be used as the distance M from the reference height position 14 to the lower end part of the in-furnace structure 10.

Then, from the following expression (1), a lower end part position error G which is a difference between the distance M to the lower end part of the in-furnace structure 10, the distance M obtained by the measurement, and a reference distance L (refer to FIG. 2) from the previously set reference height position 14 to the lower end part of the in-furnace structure 10 is obtained.

$$G=M-L \quad \text{Expression (1)}$$

At this time, as the reference distance L from the reference height position 14 to the lower end part of the in-furnace structure 10, it is preferable that the same value is used at all times in one apparatus. This conveniently facilitates setting the design reference dimensions of the apparatus and in-furnace members.

Furthermore, as in the following expression (2), by adding the lower end part position error G obtained in the manner described above to a distance H (refer to FIG. 2) from the reference height position 14 to a melt surface position, a target distance P from the melt surface 7a to the reference height position 14 is obtained.

$$P=H+G \quad \text{Expression (2)}$$

At this time, as the distance H from the reference height position 14 to the melt surface position, a value obtained by adding, to a value obtained by adding the reference distance L to a melt surface space set at a proper value to achieve desired crystal quality, a melt position movement distance and a melt position change distance in a process from the attachment of a seed crystal to a crystal straight body when the crystal is pulled upwardly can be set. Moreover, in one apparatus, it is preferable that the same value is used at all times as the value of the distance H from the reference height position 14 to the melt surface position.

Then, by setting the initial position of the melt surface 7a such that the target distance P obtained by the expression (2) is attained, the melt surface space 11 is adjusted to a predetermined distance.

By so doing, it is possible to adjust the melt surface space to a predetermined distance even when a part forming the in-furnace structure is replaced with another without locally providing an area which requires precision inside a furnace.

At this time, with consideration given to a situation in which the length of the in-furnace structure 10 changes by thermal expansion as a result of the furnace temperature reaching a high temperature while the crystal is being pulled upwardly, it is more preferable to determine the target distance P as follows.

First, the coefficient of linear thermal expansion of the raw material of each part of the in-furnace structure 10 which is installed in the pull chamber 3 is measured in advance. Then, the temperature of each part of the in-furnace structure portion 10, the temperature observed while the crystal is being pulled upwardly, is determined in advance by actual measurement or the temperature of each part is obtained by a numerical calculation simulation or the like.

Then, by using the temperature of each part of the in-furnace structure 10 and the coefficient of linear thermal expansion of the raw material of each part of the in-furnace structure 10 obtained by the measurement, a thermal expansion estimated length E (refer to FIG. 2) which is a length by which the in-furnace structure 10 changes by thermal expansion while the crystal is being pulled upwardly is estimated.

Incidentally, when the distance from the reference height position to the lower end part of the in-furnace structure 10 is set in advance, a thermal expansion reference length F (refer to FIG. 2) of the in-furnace structure 10 is determined in advance.

At this time, the thermal expansion reference length F is obtained by using the value of the average of the measured coefficients of linear thermal expansion of the raw materials of a plurality of in-furnace structures 10 and can be regarded as a length by which the in-furnace structure 10 changes by thermal expansion while the crystal is being pulled upwardly, the length obtained by using the temperature of each part obtained by the actual measurement or the numerical calculation simulation or the like. As for the thermal expansion reference length F and the temperature of each part, it is preferable to use the same values at all times in one apparatus.

Then, as in the following expression (3), a thermal expansion error D which is a difference between the thermal expansion estimated length E and the thermal expansion reference length F is obtained.

$$D=E-F \quad \text{Expression (3)}$$

Then, as in the following expression (4), by adding up the thermal expansion error D, the lower end part position error G, and the distance H from the reference height position 14 to the melt surface 7a, the target distance P from the reference height position 14 to the melt surface 7a with consideration given to an error caused by the thermal expansion of the in-furnace structure 10 can be obtained.

$$P=H+G+D \quad \text{Expression (4)}$$

By so doing, even when the in-furnace structure has an error caused by thermal expansion, it is possible to adjust the melt surface space to a predetermined distance more reliably.

After the melt surface space 11 is adjusted to a predetermined distance in the above manner, the wire 9 is unwound by the wire driving portion 12 and the tip of the seed crystal 8 held by the seed crystal holder 8a is brought into contact with the melt surface 7a. Then, the seed crystal 8 is pulled upwardly by winding the wire 9 at a predetermined rate with each of the crucible holding shaft 5 and the wire 9 being rotated in a predetermined direction of rotation and at a predetermined rotational rate, whereby a silicon single crystal is obtained under the seed crystal 8.

By performing the production of the single crystal in this manner, since it is possible to adjust the melt surface space to a predetermined distance even when a part forming the in-furnace structure is replaced with another without locally providing an area which requires precision inside a furnace, it is possible to achieve a desired pulling rate and temperature distribution and reduce the number of crystal defects in the single crystal pulled upwardly.

EXAMPLE

Hereinafter, the present invention will be described in more detail with reference to Examples and Comparative Example, but the present invention is not limited thereto.

Example 1

Figure 3:
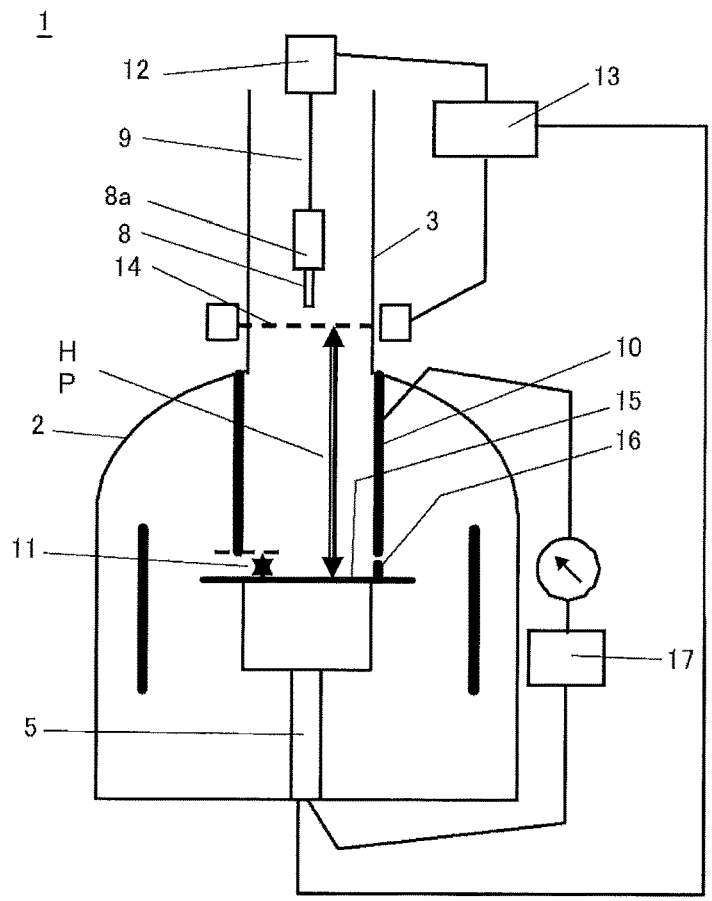
FIG. 3 is a schematic diagram depicting an example of a method for measuring a melt surface space by using a single crystal production apparatus in Example.

As depicted in FIG. 3, in order to measure the melt surface space 11, a measuring jig 15 imitating the melt surface was placed inside the main chamber 2 of the single crystal production apparatus 1. On the measuring jig 15, a protrusion 16 is disposed.

To the protrusion 16, one output terminal of a power supply 17 is connected via the crucible holding shaft 5, and, to the in-furnace structure 10, the other output terminal of the power supply 17 is connected. Then, by detecting a current which flows when the protrusion 16 and the lower end part of the in-furnace structure 10 make contact with each other, it is possible to detect electrically contact between the protrusion 16 and the lower end part of the in-furnace structure 10.

First, in a state in which the in-furnace structure 10 was placed in the pull chamber 3, the distance M (refer to FIG. 2) from the reference height position 14 to the lower end part of the in-furnace structure 10 was obtained by measurement. Then, by the expressions (1) and (2) described above, the target distance P (refer to FIG. 2) from the reference height position 14 to the melt surface was obtained. Then, an adjustment of the initial position of the measuring jig 15 was performed such that the target distance P thus obtained was attained.

Then, the measuring jig 15 was moved upward by the crucible holding shaft 5, and the position of the measuring jig 15 at the time of the electrical detection of the contact between the protrusion portion 16 and the lower end part of the in-furnace structure 10 was measured. Then, a value obtained by adding the height of the protrusion portion 16 to the distance from the measured position to the position in which the adjustment of the initial position of the measuring jig 15 was performed was measured, and this value, that is, was set at the distance of the melt surface space 11 between the melt surface and the lower end part of the in-furnace structure 10.

Next, after each of five members of a plurality of members forming the in-furnace structure 10 was replaced with another, the distance M from the reference height position 14 to the lower end part of the in-furnace structure 10 was measured in a manner similar to that described above, a correction target distance was derived, and an adjustment of the initial position of the melt surface 7a was performed. This operation was repeated until the number of pieces of measurement data of the melt surface space became ten. The measurement results thus obtained are shown in Table 1.

Incidentally, the reference distance L (refer to FIG. 2) from the reference height position 14 to the lower end part of the in-furnace structure 10 was set at 960.7 mm in advance, the distance H (refer to FIG. 2) from the reference height position 14 to the melt surface 7a was set at 990.70 mm in advance, and a target for the melt surface space 11 between the melt surface 7a and the in-furnace structure 10 was set at 30 mm in advance.

TABLE 1

| | REFERENCE DISTANCE L FROM REFERENCE HEIGHT POSITION TO LOWER END PART OF IN-FURNACE STRUCTURE [mm] | | DISTANCE H FROM REFERENCE HEIGHT POSITION TO MELT SURFACE [mm] | | SPACE BETWEEN MELT SURFACE AND LOWER END PART OF IN-FURNACE STRUCTURE [mm] |
|---|---|---|---|---|---|
| REFERENCE VALUE | 960.70 | | 990.70 | | 30.00 |

| | DISTANCE M FROM REFERENCE HEIGHT POSITION TO LOWER END PART OF IN-FURNACE STRUCTURE [mm] | LOWER END PART POSITION ERROR G [mm] | TARGET DISTANCE P FROM REFERENCE HEIGHT POSITION TO MELT SURFACE [mm] | SPACE BETWEEN MELT SURFACE AND LOWER END PART OF IN-FURNACE STRUCTURE [mm] | ERROR IN MELT SURFACE SPACE [mm] |
|---|---|---|---|---|---|
| MEASURED VALUE 1 | 960.94 | 0.24 | 990.94 | 30.04 | 0.04 |
| MEASURED VALUE 2 | 960.71 | 0.01 | 990.71 | 29.97 | −0.03 |
| MEASURED VALUE 3 | 961.40 | 0.70 | 991.40 | 29.99 | −0.01 |
| MEASURED VALUE 4 | 960.83 | 0.13 | 990.83 | 30.03 | 0.03 |
| MEASURED VALUE 5 | 960.88 | 0.18 | 990.88 | 29.99 | −0.01 |
| MEASURED VALUE 6 | 960.92 | 0.22 | 990.92 | 30.02 | 0.02 |
| MEASURED VALUE 7 | 960.73 | 0.03 | 990.73 | 29.97 | −0.03 |
| MEASURED VALUE 8 | 961.35 | 0.65 | 991.35 | 30.00 | 0.00 |
| MEASURED VALUE 9 | 960.84 | 0.14 | 990.84 | 30.02 | 0.02 |
| MEASURED VALUE 10 | 960.88 | 0.18 | 990.88 | 29.99 | −0.01 |

Comparative Example 1

By using the parts of the same in-furnace structure 10 as the in-furnace structure 10 of Example 1 except that measurement from the reference height position 14 to the lower end part of the in-furnace structure 10 and an adjustment of the initial position of the melt surface 7a based on the measurement results were not performed, measurement of the melt surface space 11 was performed ten times. The measurement results thus obtained are shown in Table 2.

TABLE 2

| | SPACE BETWEEN MELT SURFACE AND LOWER END PART OF IN-FURNACE STRUCTURE [mm] | |
|---|---|---|
| REFERENCE VALUE | 30.00 | |

| | SPACE BETWEEN MELT SURFACE AND LOWER END PART OF IN-FURNACE STRUCTURE [mm] | ERROR IN MELT SURFACE SPACE [mm] |
|---|---|---|
| MEASURED VALUE 1 | 30.04 | 0.04 |
| MEASURED VALUE 2 | 30.16 | 0.16 |
| MEASURED VALUE 3 | 29.50 | −0.50 |
| MEASURED VALUE 4 | 30.50 | 0.50 |
| MEASURED VALUE 5 | 29.86 | −0.14 |
| MEASURED VALUE 6 | 30.07 | 0.07 |
| MEASURED VALUE 7 | 30.15 | 0.15 |
| MEASURED VALUE 8 | 29.53 | −0.47 |
| MEASURED VALUE 9 | 30.49 | 0.49 |
| MEASURED VALUE 10 | 29.83 | −0.17 |

As shown in Tables 1 and 2, it is revealed that the values of errors in the melt surface space 11 in Example 1 have become smaller than those in Comparative Example 1.

Figure 4:
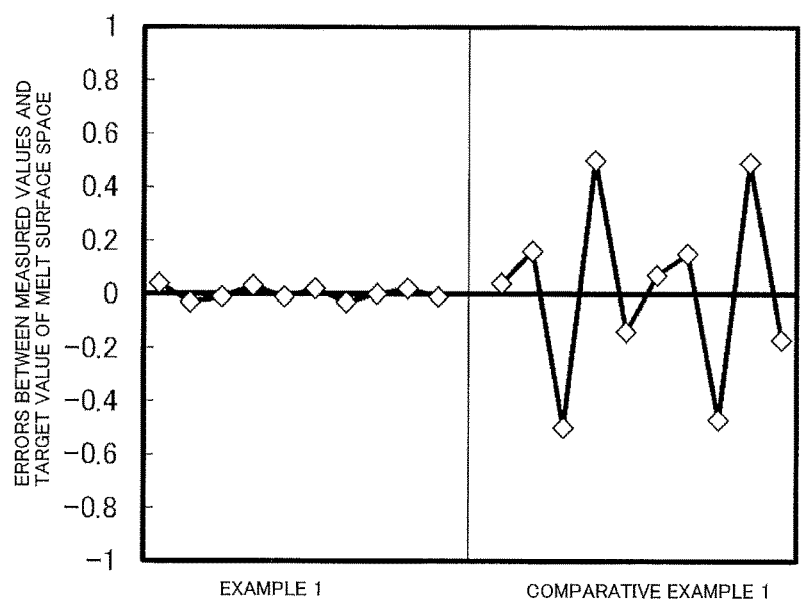
FIG. 4 is a diagram of the results of errors between measured values and a target value of the melt surface space in Example 1 and Comparative Example 1.

The errors between the measured values of Example 1 and Comparative Example 1 and the melt surface space 11 set as a target are depicted in FIG. 4 as a ratio obtained when the interval between the maximum and the minimum of Comparative Example 1 is assumed to be 1.

As depicted in FIG. 4, it is revealed that, in Example 1, a deviation from the melt surface space 11 set as a target has become stable and one-tenth or less of that in Comparative Example 1.

Example 2

The coefficient of linear thermal expansion of each raw material forming the in-furnace structure 10 disposed above the melt surface 7a was measured in advance. Then, the temperature of each part of the in-furnace structure 10 observed while the crystal was being pulled upwardly was obtained by a numerical calculation simulation. By using the temperature of each part of the in-furnace structure 10 obtained in the manner and the coefficient of linear thermal expansion of the raw material of each part of the in-furnace structure 10 obtained by the measurement, the thermal expansion estimated length E (refer to FIG. 2) by which the in-furnace structure 10 installed in the pull chamber 3 changes by thermal expansion while the crystal was being pulled upwardly was estimated.

Incidentally, as in the case of Example 1, the reference distance L from the reference height position 14 to the lower end part of the in-furnace structure 10 was set at 960.7 mm in advance, the distance H from the reference height position 14 to the melt surface 7a was set at 990.70 mm in advance, and a target for the melt surface space 11 between the melt surface 7a and the in-furnace structure 10 was set at 30 mm in advance. Then, at this time, the thermal expansion reference length F (refer to FIG. 2) of the in-furnace structure 10 was set at 1.44 mm in advance.

Then, by the expression (3), a difference between the thermal expansion estimated length E and the previously set thermal expansion reference length F was calculated, and the thermal expansion error D was obtained.

Then, as in the case of Example 1, the in-furnace structure 10 was disposed in the pull chamber 3, and the distance M from the reference height position 14 to the lower end part of the in-furnace structure 10 was obtained by measurement.

In addition, here, by the expression (4), the target distance P of the melt surface 7a with consideration given to an error caused by the thermal expansion of the in-furnace structure 10 was obtained. Then, the initial position of the melt surface 7a was adjusted such that the target distance P was attained.

Thereafter, in a state in which the inside of the furnace was heated by the heater to create the same temperature conditions as the temperature conditions observed while the crystal was being pulled upwardly, the melt surface space 11 was measured in the same manner as in Example 1.

Then, as in the case of Example 1, each of five members of the plurality of members forming the in-furnace structure 10 was replaced with another. After that, the operation was repeated again, the target distance P of the melt surface 7a with consideration given to an error caused by the thermal expansion of the in-furnace structure 10 was derived, the initial position of the melt surface 7a was adjusted such that the target distance P was attained, and measurement of the melt surface space 11 was performed. This operation was repeatedly performed until three pieces of measurement data were obtained. The measurement results thus obtained are shown in Table 3.

TABLE 3

| | REFERENCE DISTANCE L FROM REFERENCE HEIGHT POSITION TO LOWER END PART OF IN-FURNACE STRUCTURE [mm] | THERMAL EXPANSION REFERENCE LENGTH F [mm] | DISTANCE H FROM REFERENCE HEIGHT POSITION TO MELT SURFACE [mm] | SPACE BETWEEN MELT SURFACE AND LOWER END PART OF IN-FURNACE STRUCTURE [mm] |
|---|---|---|---|---|
| REFERENCE VALUE | 960.70 | 1.44 | 990.70 | 30.00 |

| | DISTANCE M FROM REFERENCE HEIGHT POSITION TO LOWER END PART OF IN-FURNACE STRUCTURE [mm] | LOWER END PART POSITION ERROR G [mm] | THERMAL EXPANSION ESTIMATED LENGTH E [mm] | THERMAL EXPANSION ERROR D [mm] | TARGET DISTANCE P FROM REFERENCE HEIGHT POSITION TO MELT SURFACE [mm] | SPACE BETWEEN MELT SURFACE AND LOWER END PART OF IN-FURNACE STRUCTURE [mm] | ERROR IN MELT SURFACE SPACE [mm] |
|---|---|---|---|---|---|---|---|
| MEASURED VALUE 1 | 960.94 | 0.24 | 1.48 | 0.03 | 990.97 | 29.95 | −0.05 |
| MEASURED VALUE 2 | 960.71 | 0.01 | 1.22 | −0.22 | 990.49 | 30.01 | 0.01 |
| MEASURED VALUE 3 | 961.40 | 0.70 | 1.64 | 0.19 | 991.59 | 30.00 | 0.00 |

As shown in Table 3, in Example 2, it was possible to keep errors between the measured values and the melt surface space 11 set as a target within ±0.1 mm.

Comparative Example 2

Measurement of the melt surface space 11 was performed three times in a state in which the inside of the furnace was heated by the heater by using the parts of the same in-furnace structure 10 as the in-furnace structure 10 of Example 2 in a manner similar to Example 2 except that measurement of the coefficient of linear thermal expansion of each raw material forming the in-furnace structure 10 and measurement of the distance M from the reference height position 14 to the lower end part of the in-furnace structure 10 were not performed and, accordingly, an adjustment of the initial position of the melt surface 7a by the expressions (3) and (4) was not performed. The measurement results thus obtained are shown in Table 4.

TABLE 4

| | SPACE BETWEEN MELT SURFACE AND LOWER END PART OF IN-FURNACE STRUCTURE [mm] | |
|---|---|---|
| REFERENCE VALUE | 30.00 | |
| | SPACE BETWEEN MELT SURFACE AND LOWER END PART OF IN-FURNACE STRUCTURE [mm] | ERROR IN MELT SURFACE SPACE [mm] |
| MEASURED VALUE 1 | 30.16 | 0.16 |
| MEASURED VALUE 2 | 30.29 | 0.29 |
| MEASURED VALUE 3 | 29.29 | −0.71 |

As shown in Table 4, in Comparative Example 2, the values of errors between the measured values and the melt surface space 11 set as a target were larger than the values of Example 2.

Figure 5:
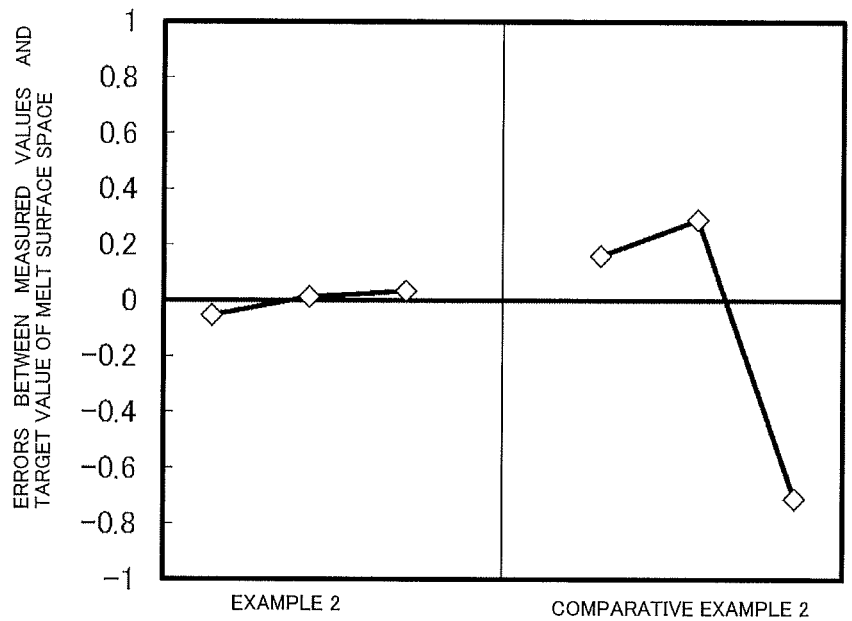
FIG. 5 is a diagram of the results of errors between measured values and a target value of the melt surface space in Example 2 and Comparative Example 2.

The measurement results of Example 2 and Comparative Example 2, the errors between the measured values and the melt surface space 11 set as a target are depicted in FIG. 5 as a ratio obtained when the interval between the maximum and the minimum of Comparative Example 2 is assumed to be 1.

As depicted in FIG. 5, in Example 2, as compared to Comparative Example 2, a deviation from the melt surface space 11 after the adjustment of the initial position of the melt surface 7a was within one-tenth of that of the existing example.

Example 3

After the melt surface space was adjusted in a manner similar to Example 2, the tip of the seed crystal 8 held by the seed crystal holder 8a was brought into contact with the melt surface 7a by unwinding the wire 9 by the wire driving portion 12, and the seed crystal 8 was then pulled upwardly by winding the wire 9 at a predetermined rate with each of the crucible holding shaft and the wire being rotated in a predetermined direction of rotation and at a predetermined rotational rate, whereby a silicon single crystal was grown.

Then, as in the case of Example 2, each of parts of the in-furnace structure 10 was replaced with another, the melt surface space was adjusted, and a silicon single crystal was grown. This operation was performed multiple times, whereby a plurality of silicon single crystals were obtained.

Figure 6:
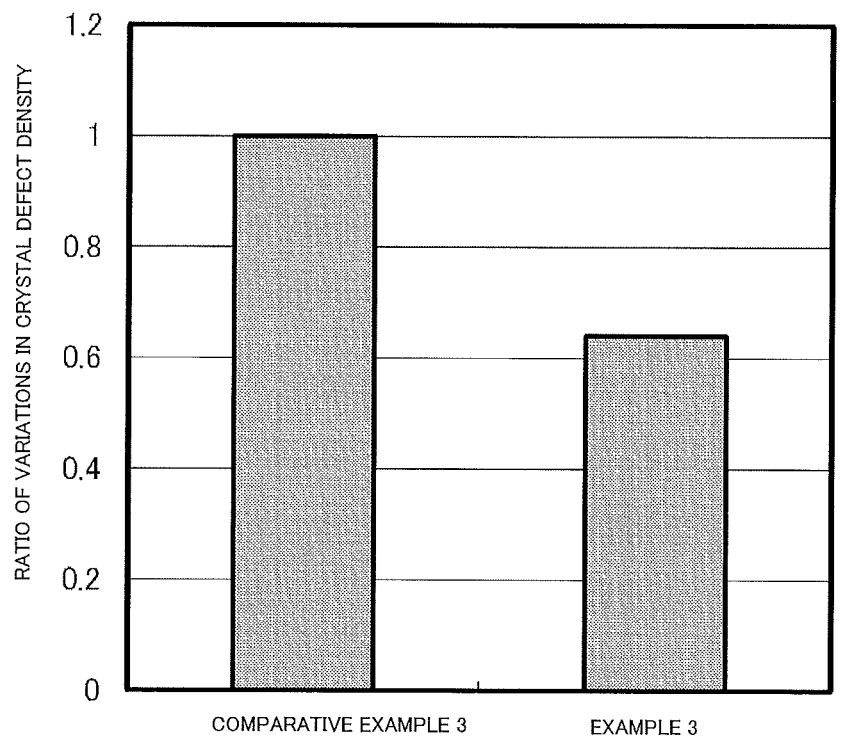
FIG. 6 is a diagram of the results of variations in crystal defect density in Example 3 and Comparative Example 3.

Then, the crystal defect densities of the grown single crystals were measured, variations in crystal defect density at this time are depicted in FIG. 6 as a ratio obtained when variations in crystal defect density in Comparative Example 3, which will be described later, are assumed to be 1.

As is clear from the results of Example 2, in the present invention, it is possible to adjust the space between the lower end part of the in-furnace structure 10 and the melt surface 7a such that errors between the space and a predetermined distance fall within ±0.1 mm.

As a result, when the growth of a single crystal is then performed as in Example 3, it is revealed that, as depicted in FIG. 6, the ratio of variations in crystal defect density is reduced by about one third compared to Comparative Example 3. As described above, it was possible to stabilize the crystal defect quality level.

Comparative Example 3

A plurality of silicon single crystals were produced in a manner similar to Example 3 except that an adjustment of the initial position of the melt surface 7a was performed by combining the methods of Patent Document 1 and Patent Document 5. Then, the crystal defect densities of the obtained silicon single crystals were measured.

In accordance with the method described in Patent Document 5, variations within ±1 mm were observed in the measured values of the melt surface space based on the reflected image, and, even when the methods of Patent Document 1 and Patent Document 5 were combined and performed, an error within ±1 mm occurs even when the initial position of the melt surface is adjusted. As a result, as depicted in FIG. 6, compared to Example 3, greater variations in crystal defect density were observed.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for producing a single crystal, the method by which, when a single crystal is grown by a Czochralski method by pulling the single crystal upwardly by a wire from raw material melt in a crucible, a single crystal is grown by adjusting a space between a melt surface of the raw material melt and a lower end part of an in-furnace structure which is disposed above the melt surface to a predetermined distance, wherein the space is adjusted to a predetermined distance by measuring a distance from a reference height position at a predetermined height located in a pull chamber and above the melt surface to the lower end part of the in-furnace structure in a state in which the in-furnace structure above the melt surface is installed in the pull chamber, obtaining a lower end part position error which is a difference between the measured distance and a distance from the previously set reference height position to the lower end part of the in-furnace structure, obtaining a target distance from the melt surface to the reference height position by adding the lower end part position error and a distance from the reference height position to a melt surface position, and adjusting a distance from an initial position of the melt surface to the reference height position such that the target distance is attained, the distance from the reference height position at the predetermined height located in the pull chamber and above the melt surface to the lower end part of the in-furnace structure is measured by closing the lower end part of the in-furnace structure with a flat plate to form a flat surface, and unwinding the wire by a wire driving portion to move downward the seed crystal that is held by the seed crystal holder located at the end of the wire, and a distance that the seed crystal is moved from the reference height position to the flat surface is used as the distance from the reference height position at the predetermined height located in the pull chamber and above the melt surface to the lower end part of the in-furnace structure.

2. The method for producing a single crystal according to claim 1, wherein
when the target distance is obtained, the target distance is obtained by estimating a length by which the in-furnace structure above the melt surface subjected to measurement of the distance to the lower end part of the in-furnace structure changes by thermal expansion, obtaining, when the distance from the reference height position to the lower end part of the in-furnace structure is set in advance, a thermal expansion error which is a difference between a previously set thermal expansion reference length of the in-furnace structure and the estimated length, and adding up the thermal expansion error, the lower end part position error, and the distance from the reference height position to the melt surface position.

* * * * *